(12) United States Patent
Kang et al.

(10) Patent No.: US 7,920,328 B2
(45) Date of Patent: Apr. 5, 2011

(54) LENS MODULE AND A METHOD FOR FABRICATING THE SAME

(75) Inventors: Wei-Hung Kang, Hsinchu (TW); Chia-Yang Chang, Hsinchu (TW); Jung-Jung Kuo, Hsinchu (TW); Yu-Hui Lee, Nantou (TW)

(73) Assignee: VisEra Technologies Company Limited, Hsinchu (TW)

( * ) Notice: Subject to any disclaimer, the term of this patent is extended or adjusted under 35 U.S.C. 154(b) by 140 days.

(21) Appl. No.: 12/039,257

(22) Filed: Feb. 28, 2008

(65) Prior Publication Data

US 2009/0219632 A1    Sep. 3, 2009

(51) Int. Cl.
*G02B 27/10* (2006.01)
*G02B 7/02* (2006.01)

(52) U.S. Cl. .................................. 359/619; 359/811

(58) Field of Classification Search .......... 359/694–700, 359/619, 620, 642, 811–824
See application file for complete search history.

(56) References Cited

U.S. PATENT DOCUMENTS

| 4,154,506 A | 5/1979 | Yevick ........................ 359/626 |
| 6,707,613 B2 * | 3/2004 | Fujimoto et al. ............. 359/622 |
| 6,894,840 B2 * | 5/2005 | Yamanaka et al. ........... 359/619 |
| 6,985,298 B2 * | 1/2006 | Yamanaka et al. ........... 359/619 |
| 7,397,486 B2 * | 7/2008 | Kurose et al. ................ 347/135 |
| 7,561,336 B2 * | 7/2009 | Osaka et al. ................. 359/619 |
| 2002/0196563 A1 | 12/2002 | Itoh ............................. 359/741 |

FOREIGN PATENT DOCUMENTS

CN        1726409 A       1/2006

* cited by examiner

*Primary Examiner* — Mohammed Hasan
(74) *Attorney, Agent, or Firm* — Muncy, Geissler, Olds & Lowe, PLLC

(57) ABSTRACT

A lens module and a method for fabricating the same are disclosed. The module comprises a substrate and a lens structure. The substrate comprises a through-hole therein. The lens structure is embedded in the through-hole.

5 Claims, 6 Drawing Sheets

LENS MODULE AND A METHOD FOR FABRICATING THE SAME

BACKGROUND OF THE INVENTION

1. Field of the Invention

The invention relates to semiconductor technology and more particularly to a lens module.

2. Description of the Related Art

FIG. 1A is a cross-section of a conventional lens module. In FIG. 1A, a glass substrate 1 is utilized for formation of a lens module 10. A plurality of lens modules 10 may be formed on the glass substrate 1. The lens module 10 comprises a first lens part 11, a second lens part 12 and a glass portion 13, wherein the glass substrate 1 is between the first and second lens parts 11 and 12. The first and second lens parts 11 and 12 are formed by transparent polymer.

FIG. 1B is a cross-section of the conventional lens module 10 and molding dice 20 and 30 for formation of the lens module 10. The molding die 20 comprises a pattern 21 for formation of the first lens part 11 of the lens module 10, and the molding die 30 comprises a pattern 31 for formation of the second lens part 12 of the lens module 10.

The lens module 10 is formed by the subsequent steps. First, a lens material (not shown) is dispensed on a first surface 1a of the glass substrate 1. Then, the molding die 20 is disposed on the first surface 1a of the glass substrate 1, imprinting and shaping the lens material utilizing the pattern 21, followed by curing the shaped lens material to complete the first lens part 11 of the lens module 10. Next, the same lens material (not shown) is dispensed on the pattern 31 of the molding die 30. Then, the combination of the glass substrate 1 and the molding die 20 is moved toward the molding die 30, and a second surface 1b, opposite to the surface 1a, of the glass substrate 1 contacts the pattern 31 of the molding die 30 to imprint and shape the lens material on the pattern 31 of the molding die 30, followed by curing the shaped lens material to complete the second lens part 12 of the lens module 10. Thus, the lens module 10 is complete. Finally, the glass substrate 1 with the lens module 10 and the molding dice 20 and 30 are separated.

As described, there are many process steps required for fabrication of the lens module 10. The first lens part 11 of the lens module 10 is twice cured, and thus, may be over hardened. At least two problems may occur due to over hardening of the first lens part 11 of the lens module 10. One is shrinkage variation of the first lens part 11, and the other is color yellowing of the first lens part 11. These problems have the potential to negatively affect the optical performance of the lens module 10. Further, the lens module 10 is not homogeneous because the first and second lens parts 11 and 12 are polymer, and the glass portion 13 is glass. The polymer and glass have different refractive indexes, and light total reflection occurs in the interface therebetween. Thus, there are two glass/polymer interfaces in the lens module 10, negatively affecting light transmittance thereof. Moreover, further process steps are required for formation of dam structures (not shown) and/or light shields (not shown) for the lens module 10.

BRIEF SUMMARY OF THE INVENTION

Embodiments of the invention provide lens modules and methods for fabricating the same, which improves optical performance of lens modules and decrease process steps for fabrication of lens modules.

An embodiment of the invention further provides a lens module comprising a substrate and a lens structure. The substrate comprises a through-hole therein. The lens structure is embedded in the through-hole.

An embodiment of the invention further provides a method for fabricating a lens module. First, a substrate comprising a through-hole therein is provided. Then, a first molding die comprising a first lens pattern corresponding to the through-hole, and a second molding die comprising a second lens pattern corresponding to the through-hole are provided. Next, the substrate is disposed on the first molding die. The through-hole of the substrate is aligned with the first lens pattern. Next, a lens material is dispensed in the through-hole and on the first lens pattern. Following, the second molding die is disposed on the substrate and the lens material is imprinted. The second lens pattern is aligned with the through-hole of the substrate. The lens material is shaped into a lens structure embedded in the through-hole by the first and second lens patterns. Finally, the first molding die, the substrate comprising the lens structure in the through-hole, and the second molding die are separated.

Further scope of the applicability of the invention will become apparent from the detailed description given hereinafter. It should be understood however, that the detailed description and specific examples, while indicating preferred embodiments of the invention, are given by way of illustration only, as various changes and modifications within the spirit and scope of the invention will become apparent to those skilled in the Art from this detailed description.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

In the subsequent description, phrases such as "substantially homogeneous" means expected to be homogeneous in design, as in practice, it is difficult to be mathematically or completely homogeneous. Additionally, when deviation is in an acceptable range of a corresponding standard or specification, it is also recognized to be homogeneous. Those skilled in the art are expected to acknowledge, that different standards or specifications depend upon various properties and conditions, and thus, cannot be specifically listed.

Figure 1A:
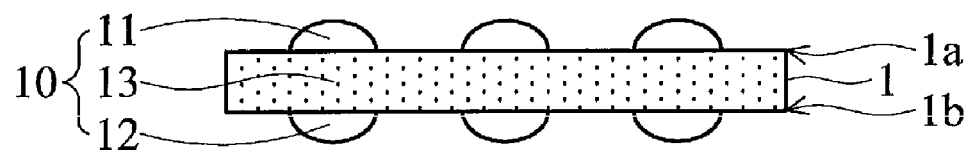
FIG. 1A shows a cross-section of a conventional lens module.
Figure 1B:
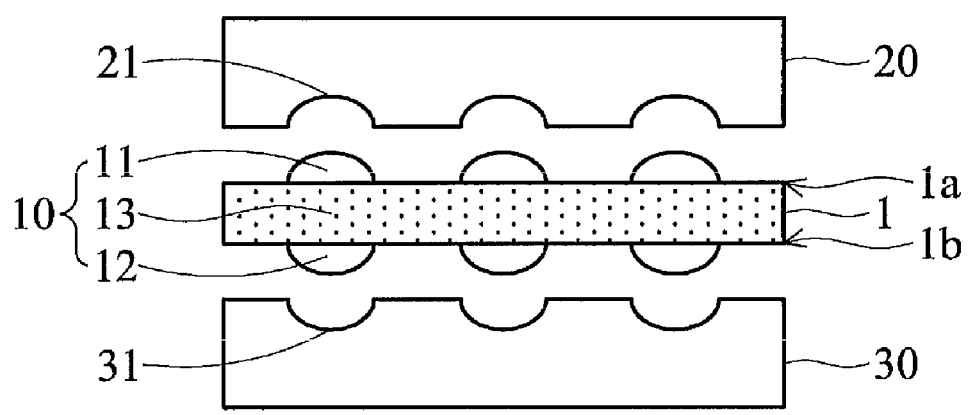
FIG. 1B shows a cross-section of the conventional lens module shown in FIG. 1A and molding dice formation thereof.
Figure 2A:
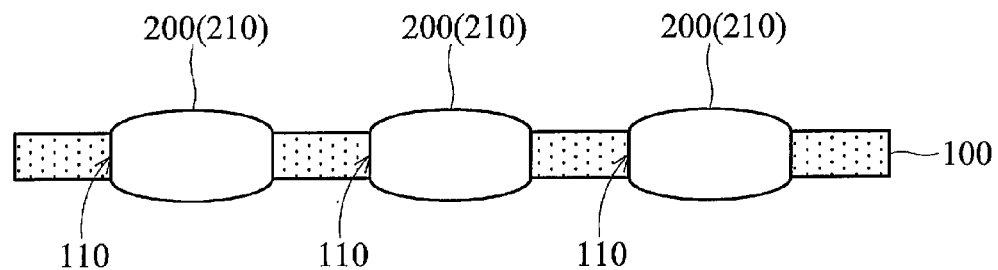
FIGS. 2A through 2C show cross-sections of lens modules of preferred embodiments of the invention.
Figure 2B:
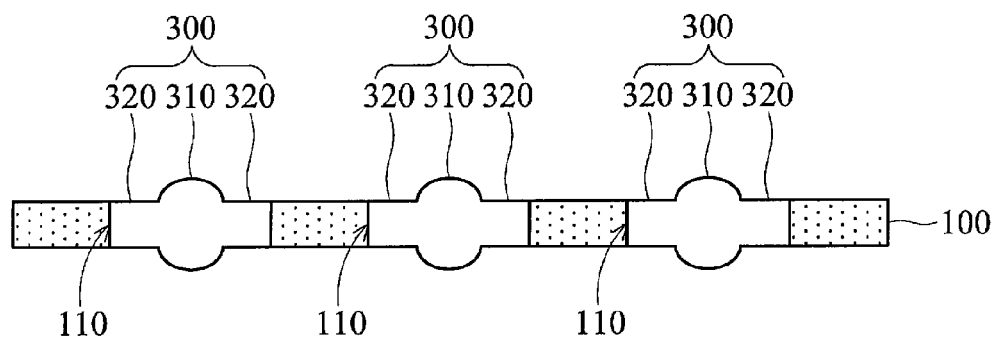
Figure 2C:
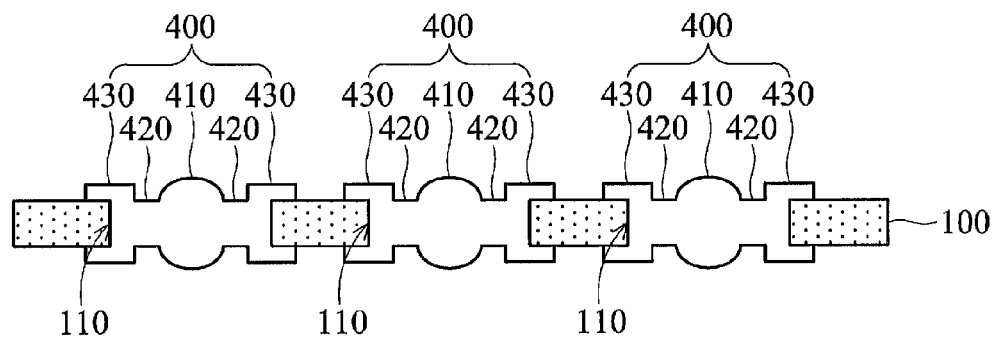

FIGS. 2A through 2C are cross-sections of lens modules of preferred embodiments of the invention.

In FIG. 2A, the lens module comprises a substrate 100 and a lens structure 200. The substrate 100 comprises a through-hole 110, and the lens structure 200 is embedded in the through-hole 110. Thus, the lens structure 200 can be homogeneous or substantially homogeneous and contains no substrate portions, preventing incident light loss resulting from total reflection, and improving the optical performance of the inventive lens module.

The substrate 100 can be transparent, semi-opaque, or opaque. The substrate 100 can be glass, or other materials. In this embodiment, the substrate 100 is a glass substrate and is transparent. The lens structure 200 can be any known transparent polymer. In this embodiment, the lens structure 200 comprises a lens body 210 directly connecting side walls of the through-hole 110. In this embodiment, the lens body 210 is a biconvex lens. In other embodiment, the lens body 210 can be other types of lenses, such as a plano-convex lens, meniscus lens, concave lens, or other known types of lenses.

Compared to the lens module shown in FIG. 2A, the lens module shown in FIG. 2B replaces the lens structure 200 embedded in the through-hole 110 by a lens structure 300. In FIG. 2B, the lens structure 300 comprises a lens body 310 and a connection component 320. The connection component 320 connects the lens body 310 and sidewalls of the through-hole 110. In this embodiment, the lens body 310 is at a center region of the through-hole 110, and is surrounded by the connection component 320. In other embodiments, parts of the lens body 310 may directly connect parts of the sidewalls of the through-hole 110, and the connection component 320 connecting the other parts of the lens body 310 and other parts of the sidewalls of the through-hole 110. In this embodiment, the lens body 310 is a biconvex lens. In other embodiment, the lens body 310 can be other types of lens, such as a plano-convex lens, meniscus lens, concave lens, or other known types of lens.

Compared to the lens module shown in FIG. 2A, the lens module shown in FIG. 2C replaces the lens structure 200 embedded in the through-hole 110 by a lens structure 400. In FIG. 2C, the lens structure 400 comprises a lens body 410, a connection component 420, and a dam structure 430. The dam structure 430 is disposed overlying at least parts of the sidewalls of the through-hole 110 and extends out of the through-hole 110. In some embodiments, the dam structure 430 can be utilized for shielding undesired incident light. The connecting component 420 connects the lens body 410 and the dam structure 430. In this embodiment, the lens body 410 is a biconvex lens. In other embodiment, the lens body 410 can be other types of lens, such as a plano-convex lens, meniscus lens, concave lens, or other known types of lenses.

In this embodiment, the dam structure 430 is disposed overlying all parts of the sidewalls of the through-hole 110 and extends out of the through-hole 110, the dam structure 430 surrounds the connecting component 420, and the connecting component 420 surrounds the lens body 410. In some cases, parts of the lens body 410 may directly connect parts of the dam structure 430, and the connection component 420 connects other parts of the lens body 410 and other parts of the dam structure 430.

In some embodiments, the dam structure 430 is only disposed on parts of sidewalls of the through-hole 110 and extends out of the through-hole 110. In some cases, parts of the lens body 410 may directly connect parts of the sidewalls without the dam structure 430, and tie other parts of the lens body 410 is connected by a connection component 420 to the dam structure 430 and other parts of the sidewalls without the dam structure 430. In some cases, the connection component 420 connects the lens body 410 to the dam structure 430 and other parts of the sidewalls of the through-hole 110.

Figure 3:
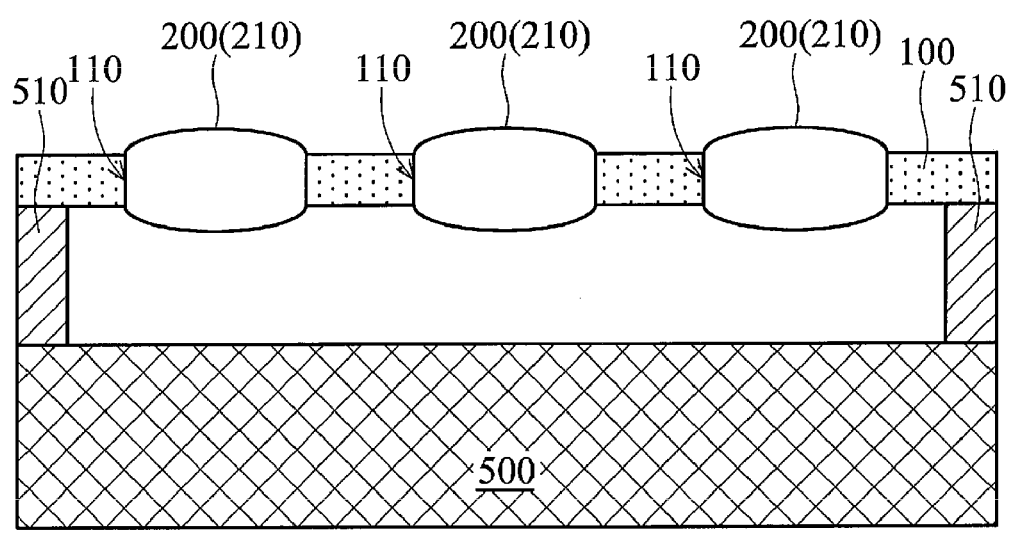
FIG. 3 shows a cross-section of an application of lens modules of preferred embodiments of the invention.

FIG. 3 shows a cross-section of an application of the lens module shown in FIG. 2A. In FIG. 3, the lens module shown in FIG. 2A is disposed overlying a semiconductor substrate 500 and is supported by spacers 510 therebetween. The lens bodies 210 respectively correspond to light sensing elements (not shown) in or on the substrate 500. In other embodiments, the lens modules shown in FIGS. 2B and 2C can be disposed overlying the semiconductor substrate 500 in the same way.

Figure 4A:
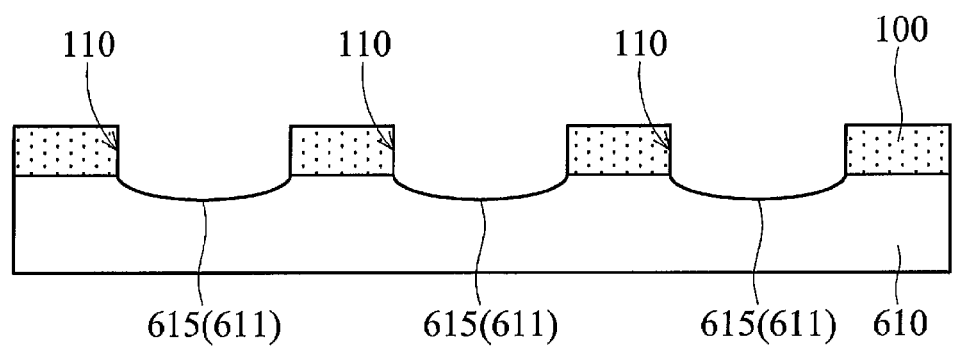
FIGS. 4A through 4C show cross-sections of an exemplary method for fabricating the lens module shown in FIG. 2A.
Figure 4B:
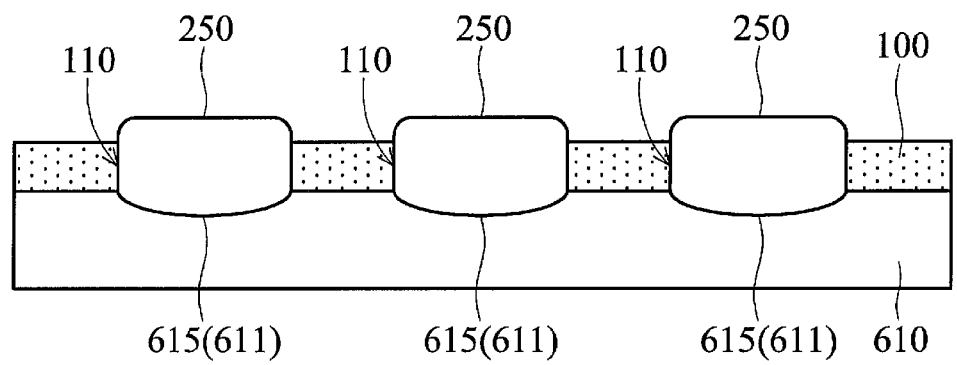
Figure 4C:
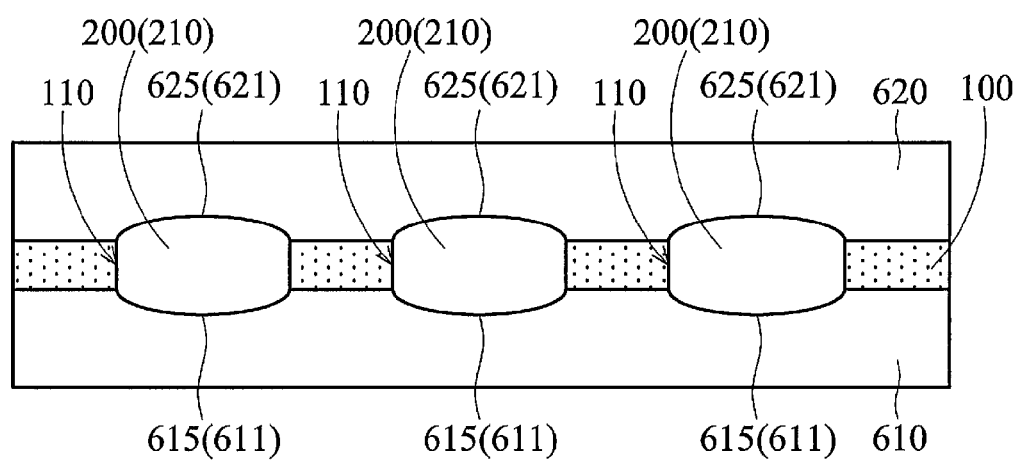

FIGS. 4A through 4C show cross-sections of an exemplary method for fabricating the lens module shown in FIG. 2A.

In FIG. 4A, the substrate 100 comprising the through-hole 110 therein, and a molding die 610 comprising a lens pattern 615 corresponding to the through-hole 110 are provided. The lens pattern 615 comprises a lens body pattern 611 comprising a profile of the lens body 210 of the lens module shown in FIG. 2A. Then, the through-hole 110 of the substrate 100 is aligned with the lens pattern 615 of the molding die 610, and the substrate 100 is disposed on the molding die 610.

In FIG. 4B, a lens material 250 is in the through-hole 110 and on the first lens pattern 615. The lens material is preferably a thermally curable transparent polymer or a transparent polymer able to be cured by illumination of ultraviolet (UV) light.

In FIG. 4C, a molding die 620 comprising a lens pattern 625 corresponding to the through-hole 110 is provided. The lens pattern 625 comprises a lens body pattern 621 comprising a profile of the lens body 210 of the lens module shown in FIG. 2A. In this embodiment, both of the molding dice 610 and 620 comprise lens body patterns for fabricating the lens body 210 of the lens module shown in FIG. 2A. In some embodiments, only one of the molding dice 610 and 620 comprises lens body pattern for fabricating the lens body 210 of the lens module shown in FIG. 2A, while the other one supports the substrate 100 and the lens material 250 and does not have a lens body pattern comprising a profile of the lens body 210.

Next, the lens pattern 625 of the molding die 620 is aligned with the through-hole 110 of the substrate 100, and the molding die 620 is then disposed on the substrate 100. At this time the lens material 250 shown in FIG. 4B is shaped into the lens structure 200 embedded in the through-hole 110.

In a preferred embodiment, a curing step is required to harden the lens structure 200. The curing step can be performed before or after separating the molding die 610, the substrate 100 comprising the lens structure 200 is embedded in the through-hole 110, and the molding die 630, and is preferably performed before the separating step to prevent profile variation of the lens structure 200 during the curing step. The curing step can be performed by illumination of UV light or heating (thermal treatment). In this embodiment, the lens structure 200 is cured by illumination of UV light before separating the molding die 610, the substrate 100 comprising the lens structure 200 embedded in the through-hole 110, and the molding die 630. After the curing step, the molding die 610, the substrate 100 comprising the lens structure 200 embedded in the through-hole 110, and the molding die 630 are separated, completing the lens module shown in FIG. 2A.

It is appreciated that at most one curing step is required for fabricating the lens module shown in FIG. 2A, preventing over hardening, shrinkage variation, and color yellowing of the lens structure 200, and decreasing fabrication process steps.

The lens modules shown in FIGS. 2B and 2C can be fabricated by steps equivalent with those described for and shown in FIGS. 4A through 4C utilizing molding dice respectively compatible therewith.

Figure 5:
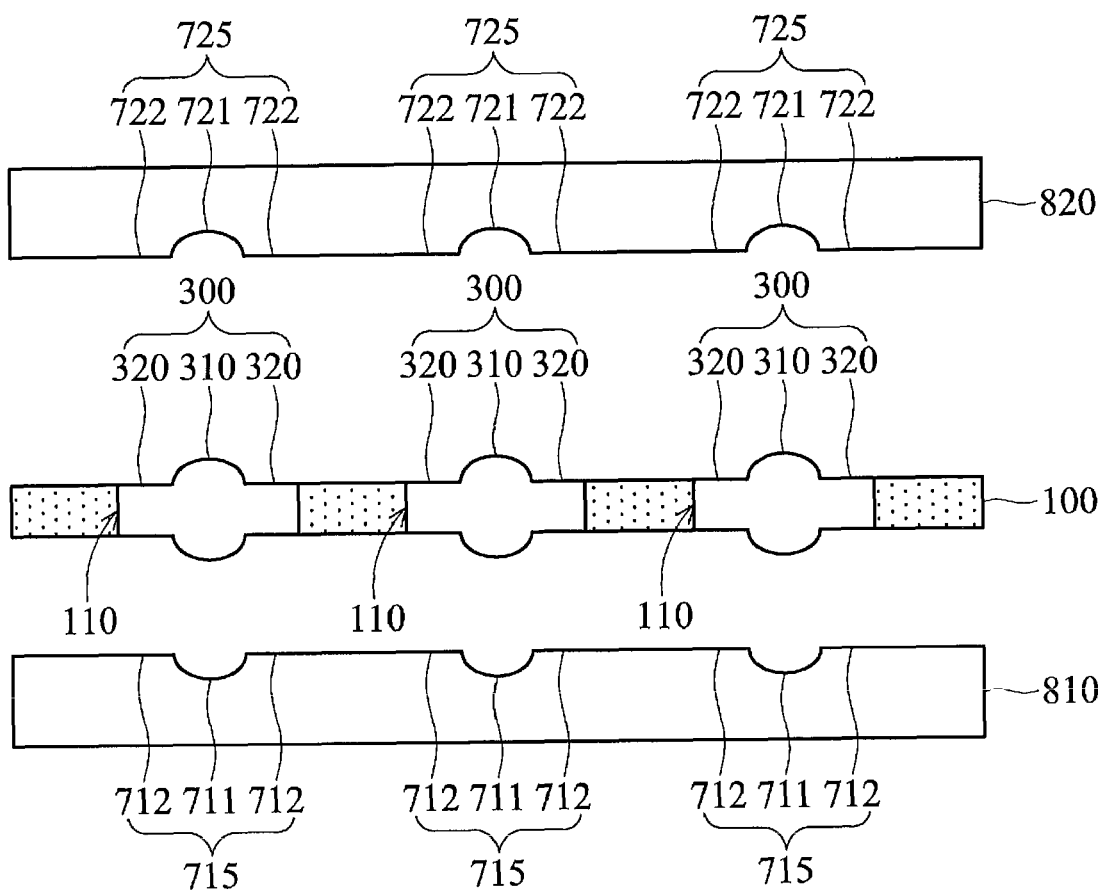
FIG. 5 shows a cross-section of the lens module shown in FIG. 2B and molding dice formation thereof.

In FIG. 5, the lens module shown in FIG. 2B and the molding dice 710 and 720 compatible therewith are shown. The molding die 710 comprises a lens pattern 715 corresponding to the through-hole 110. The lens pattern 715 comprises a lens body pattern 711 and a connecting component pattern 712 connecting to the lens body pattern 711. The lens body pattern 711 comprises a profile of the lens body 310. The connecting component pattern 712 comprises a profile of the connecting component 320. In this embodiment, the lens body 310 is surrounded by the connecting component 320, and thus, the lens body pattern 711 is surrounded by the connecting component pattern 712. In other embodiments, the arrangement of the lens body pattern 711 and the connecting component pattern 712 depends on the predetermined design for the lens body 310 and the connecting component 320.

The molding die 720 comprises a lens pattern 725 corresponding to the through-hole 110. The lens pattern 725 comprises a lens body pattern 721 and a connecting component pattern 722 connecting to the lens body pattern 721. The lens body pattern 721 comprises a profile of the lens body 310. The connecting component pattern 722 comprises a profile of the connecting component 320. In this embodiment, the lens body 310 is surrounded by the connecting component 320, and thus, the lens body pattern 721 is surrounded by the connecting component pattern 722. In other embodiments, the arrangement of the lens body pattern 721 and the connecting component pattern 722 depends on the predetermined design for the lens body 310 and the connecting component 320.

In this embodiment, both of the molding dice 710 and 720 comprise lens body patterns for fabricating the lens body 310 and connecting component patterns for fabricating the connecting component 320. In some embodiments, only one of the molding dice 710 and 720 comprises lens body pattern for fabricating the lens body 310 and connecting component pattern for fabricating the connecting component 320, while the other one supports the substrate 100 and a lens material (not shown) during processing and does not have a lens body pattern comprising a profile of the lens body 310 and connecting component pattern comprising a profile of the connecting component 320.

Figure 6:
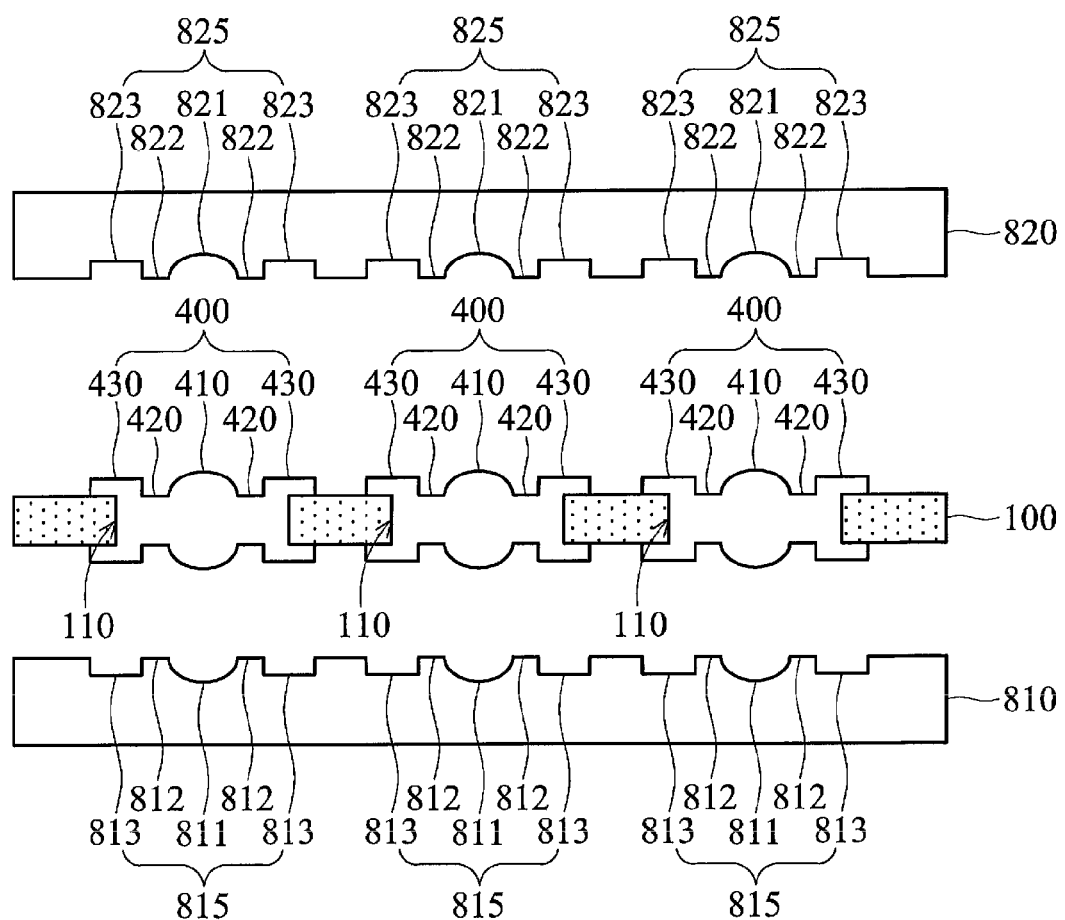
FIG. 6 shows a cross-section of the lens module shown in FIG. 2C and molding dice formation thereof.

In FIG. 6, the lens module shown in FIG. 2C and the molding dice 810 and 820 compatible therewith are shown. The molding die 810 comprises a lens pattern 815 corresponding to the through-hole 110. The lens pattern 815 comprises a lens body pattern 811, a dam structure pattern 813, and a connecting component pattern 812 connecting the lens body pattern 811 and the dam structure pattern 813. Thus, the dam structure 430 can be simultaneously fabricated with the lens body 410 and the connecting component 420, and no extra processing steps are required for the dam structure 430.

The lens body pattern 811 comprises a profile of the lens body 410. The connecting component pattern 812 comprises a profile of the connecting component 420. The dam structure pattern 813 comprises a profile of the dam structure 430. In this embodiment, the dam structure 430 surrounds the connecting component 420, and the connecting component 420 surrounds the lens body 410, and thus, the dam structure pattern 813 surrounds the connecting component pattern 812, and the connecting component pattern 812 surrounds the lens body pattern 811. In other embodiments, the arrangement of the lens body pattern 811, the connecting component pattern 812, and the dam structure pattern 813 depends on the predetermined design for the lens body 410, the connecting component 420, and the dam structure 430.

The molding die 820 comprises a lens pattern 825 corresponding to the through-hole 110. The lens pattern 825 comprises a lens body pattern 821, a dam structure pattern 823, and a connecting component pattern 822 connecting the lens body pattern 821 and the dam structure pattern 823. The lens body pattern 821 comprises a profile of the lens body 410. The connecting component pattern 822 comprises a profile of the connecting component 420. The dam structure pattern 823 comprises a profile of the dam structure 430. In this embodiment, the dam structure 430 surrounds the connecting component 420, and the connecting component 420 surrounds the lens body 410, and thus, the dam structure pattern 823 surrounds the connecting component pattern 822, and the connecting component pattern 822 surrounds the lens body pattern 821. In other embodiments, the arrangement of the lens body pattern 821, the connecting component pattern 822, and the dam structure pattern 823 depends on the predetermined design for the lens body 410, the connecting component 420, and the dam structure 430.

In this embodiment, both of the molding dice 810 and 820 comprise lens body patterns for fabricating the lens body 410, connecting component patterns for fabricating the connecting component 420, and the dam structure patterns for fabricating the dam structure 430. In some embodiments, only one of the molding dice 810 and 820 comprises a lens body pattern for fabricating the lens body 410, connecting component pattern for fabricating the connecting component 420, and dam structure pattern for fabricating the dam structure 430, while the other one supports the substrate 100 and a lens material (not shown) during processing and does not have a lens body pattern comprising a profile of the lens body 410, connecting component pattern comprising a profile of the connecting component 420, and dam structure pattern for fabricating the dam structure 430.

As described, the efficacy of the inventive lens modules and methods for fabricating the same provide homogeneous lens structures, improving optical performance of lens modules and decreasing process steps for fabrication of lens modules.

While the invention has been described by way of example and in terms of preferred embodiment, it is to be understood that the invention is not limited thereto. To the contrary, it is intended to cover various modifications and similar arrangements (as would be apparent to those skilled in the Art). Therefore, the scope of the appended claims should be accorded the broadest interpretation so as to encompass all such modifications and similar arrangements.

What is claimed is:

1. A lens module, comprising:
    a substrate comprising a through-hole therein; and
    a lens structure embedded in the through-hole, the lens structure comprising a lens body, a dam structure overlying at least part of the sidewalls of the through-hole and extending out of the through-hole, and a connecting component connecting the lens body and the dam structure, wherein at least a portion of the lens structure completely and directly contacts side walls of the through-hole.

2. The module as claimed in claim 1, wherein the substrate is a glass substrate.

3. The module as claimed in claim 1, wherein the lens structure is substantially homogeneous.

4. The module as claimed in claim 1, wherein the dam structure surrounds the connecting component and the connecting component surrounds the lens body.

5. The module as claimed in claim 1, wherein the lens module is disposed overlying a semiconductor substrate.

* * * * *